United States Patent
Chen et al.

(10) Patent No.: US 10,143,304 B2
(45) Date of Patent: Dec. 4, 2018

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/901,910

(22) Filed: Feb. 22, 2018

(65) Prior Publication Data

US 2018/0177295 A1 Jun. 28, 2018

Related U.S. Application Data

(62) Division of application No. 15/385,830, filed on Dec. 20, 2016.

(30) Foreign Application Priority Data

Jul. 13, 2016 (TW) .............................. 105122159 A

(51) Int. Cl.
A47B 88/473 (2017.01)
A47B 88/423 (2017.01)
(Continued)

(52) U.S. Cl.
CPC .......... *A47B 88/473* (2017.01); *A47B 88/407* (2017.01); *A47B 88/423* (2017.01);
(Continued)

(58) Field of Classification Search
CPC ..... A47B 88/473; A47B 88/423; A47B 88/75; A47B 88/407; A47B 88/49;
(Continued)

(56) References Cited

U.S. PATENT DOCUMENTS 6,238,031 B1 * 5/2001 Weng .................... A47B 88/407
312/333
6,257,683 B1 * 7/2001 Yang .................... A47B 88/487
312/333

(Continued)

FOREIGN PATENT DOCUMENTS

EP 2 133 006 A1 12/2009
JP 2011-92259 A 5/2011
(Continued)

*Primary Examiner* — Hiwot E Tefera
(74) *Attorney, Agent, or Firm* — Winston Hsu

(57) ABSTRACT

A slide rail assembly includes a first rail, a second rail, a releasing member and a limiting member. The second rail is movable relative to the first rail. The releasing member is mounted on the second rail. The limiting member is arranged to be corresponding to the releasing member. The limiting member is configured to be in a free status and a limiting status. When the limiting member is in the free status, the releasing member is configured to be operatively moved from a first position to a second position. When the limiting member is in the limiting status, the releasing member is not able to be operatively moved from the first position to the second position.

6 Claims, 8 Drawing Sheets

(51) Int. Cl.
*A47B 88/49* (2017.01)
*A47B 88/407* (2017.01)
*A47B 88/75* (2017.01)
*H05K 7/14* (2006.01)

(52) U.S. Cl.
CPC .............. *A47B 88/49* (2017.01); *A47B 88/75* (2017.01); *H05K 7/1489* (2013.01)

(58) Field of Classification Search
CPC ............ A47B 2088/4235; A47B 88/57; A47B 2210/0081; A47B 2210/0018; A47B 88/483; A47B 2210/0059; A47B 88/40; H05K 7/1489
USPC ........ 312/334.46, 334.44, 319.1, 333, 223.1, 312/223.2, 330.1, 334.1, 334.7, 334.47
See application file for complete search history.

(56) References Cited

U.S. PATENT DOCUMENTS

| | | | |
|---|---|---|---|
| 6,390,575 B1 * | 5/2002 | Chen | A47B 88/493 312/333 |
| 6,601,933 B1 | 8/2003 | Greenwald | |
| 6,685,033 B1 | 2/2004 | Baddour | |
| 6,899,408 B2 * | 5/2005 | Chen | A47B 88/493 312/333 |
| 6,926,377 B2 | 8/2005 | Lammens | |
| 7,118,277 B2 | 10/2006 | Chen | |
| 7,364,244 B2 * | 4/2008 | Sandoval | H05K 7/1411 312/333 |
| 7,441,848 B2 | 10/2008 | Chen | |
| 7,520,577 B2 | 4/2009 | Chen | |
| 7,604,307 B2 | 10/2009 | Greenwald | |
| 7,661,778 B2 | 2/2010 | Yang | |
| 8,147,011 B2 | 4/2012 | Chen | |
| 8,240,789 B2 | 8/2012 | Chen | |
| 8,366,217 B1 | 2/2013 | Chen | |
| 8,427,835 B2 | 4/2013 | Xu | |
| 8,511,765 B1 * | 8/2013 | Chen | A47B 67/04 312/286 |
| 8,528,999 B2 * | 9/2013 | Chen | F16C 29/005 312/333 |
| 8,562,085 B2 | 10/2013 | Chen | |
| 8,585,166 B2 * | 11/2013 | Chen | A47B 88/493 312/333 |
| 8,622,492 B2 * | 1/2014 | Chen | A47B 88/0418 312/333 |
| 8,690,271 B1 | 4/2014 | Chang | |
| 8,888,201 B2 * | 11/2014 | Chen | A47B 88/0418 312/333 |
| 9,326,603 B2 | 5/2016 | Iwamoto | |
| 9,380,872 B2 | 7/2016 | Yoneda | |
| 9,723,746 B2 | 8/2017 | Chen | |
| 2006/0288529 A1 | 12/2006 | Chen | |
| 2008/0246378 A1 * | 10/2008 | Chen | A47B 88/57 312/334.46 |
| 2011/0135224 A1 * | 6/2011 | Chen | F16C 29/04 384/26 |
| 2014/0160666 A1 | 6/2014 | Peng | |
| 2015/0123528 A1 * | 5/2015 | Wu | A47B 88/04 312/319.1 |
| 2015/0181753 A1 | 6/2015 | Murakami | |
| 2015/0245709 A1 * | 9/2015 | Iwamoto | H05K 7/1489 211/175 |
| 2016/0029791 A1 | 2/2016 | Chen | |

FOREIGN PATENT DOCUMENTS

| | | |
|---|---|---|
| JP | 2011-159716 A | 8/2011 |
| JP | 2015-122376 A | 7/2015 |
| JP | 2015-142035 A | 8/2015 |
| JP | 2015-160073 A | 9/2015 |
| WO | 2015182266 A1 | 12/2015 |

* cited by examiner

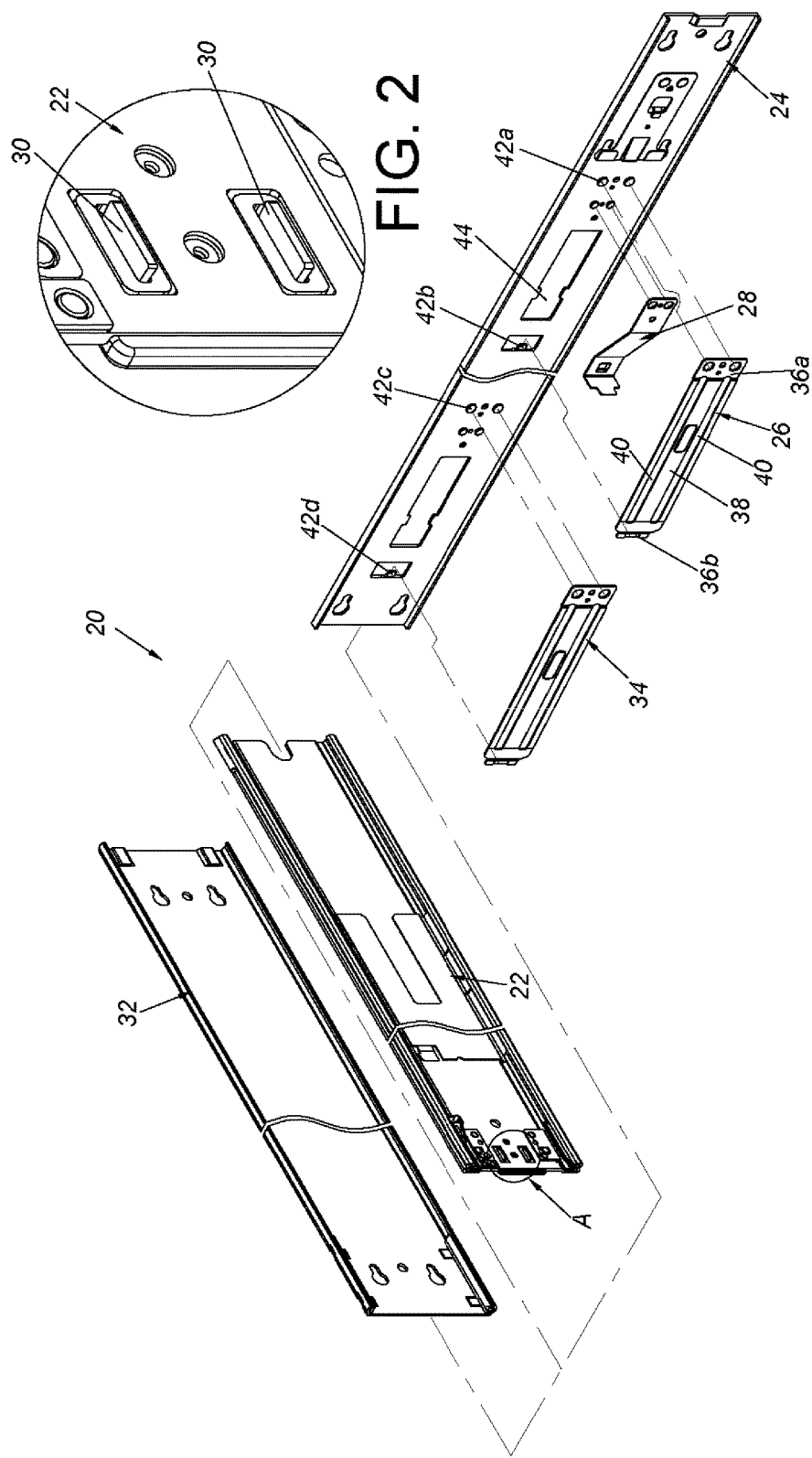

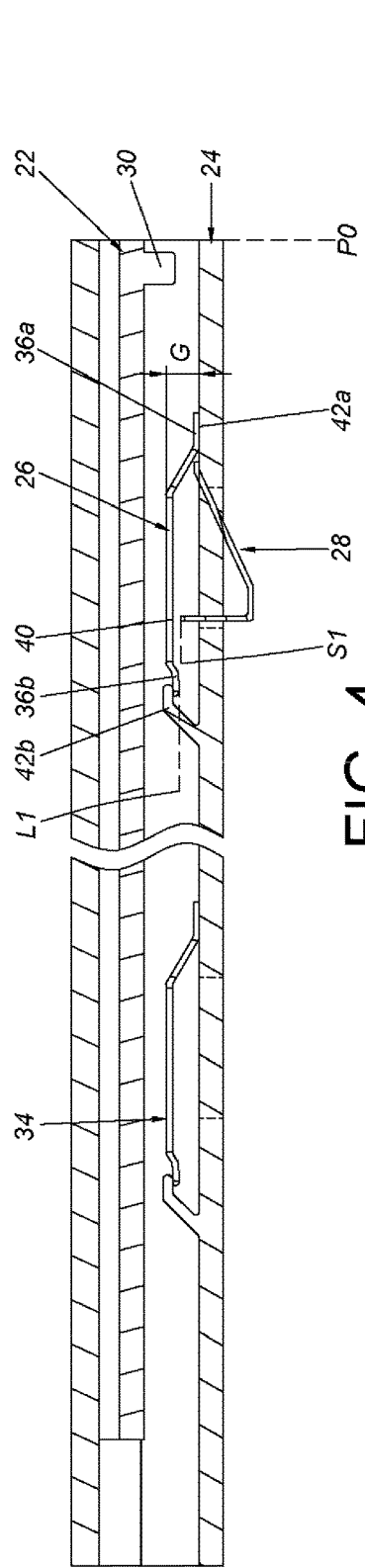
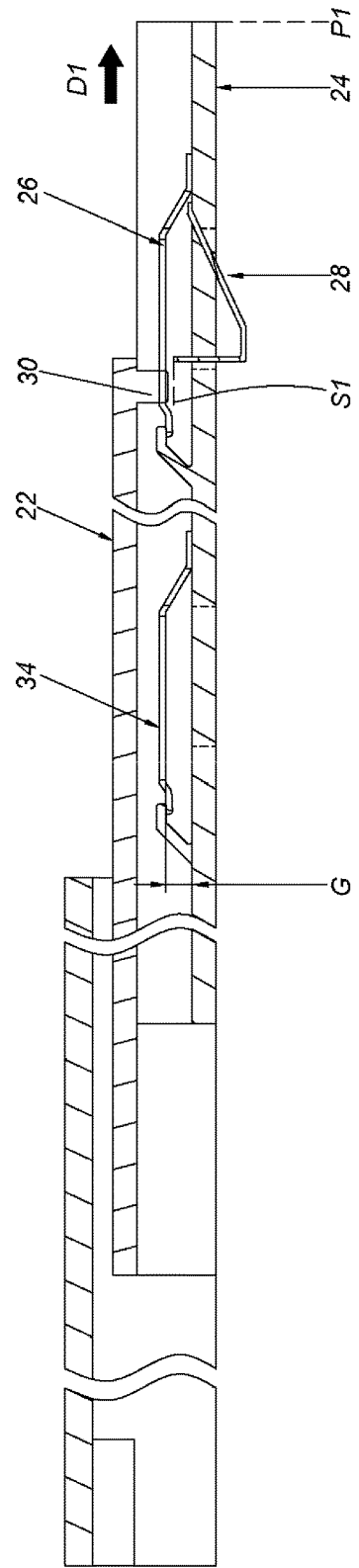
FIG. 4
FIG. 5

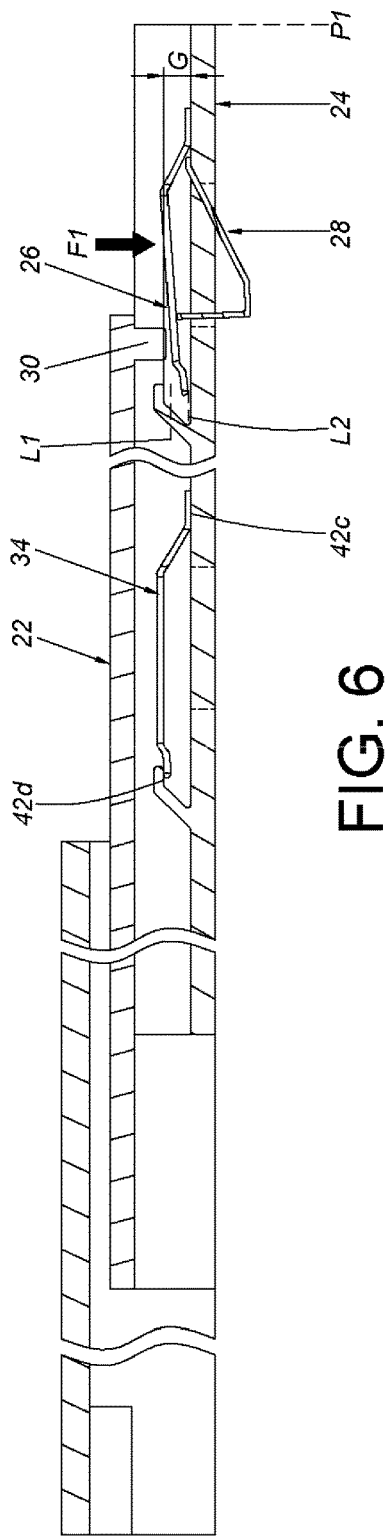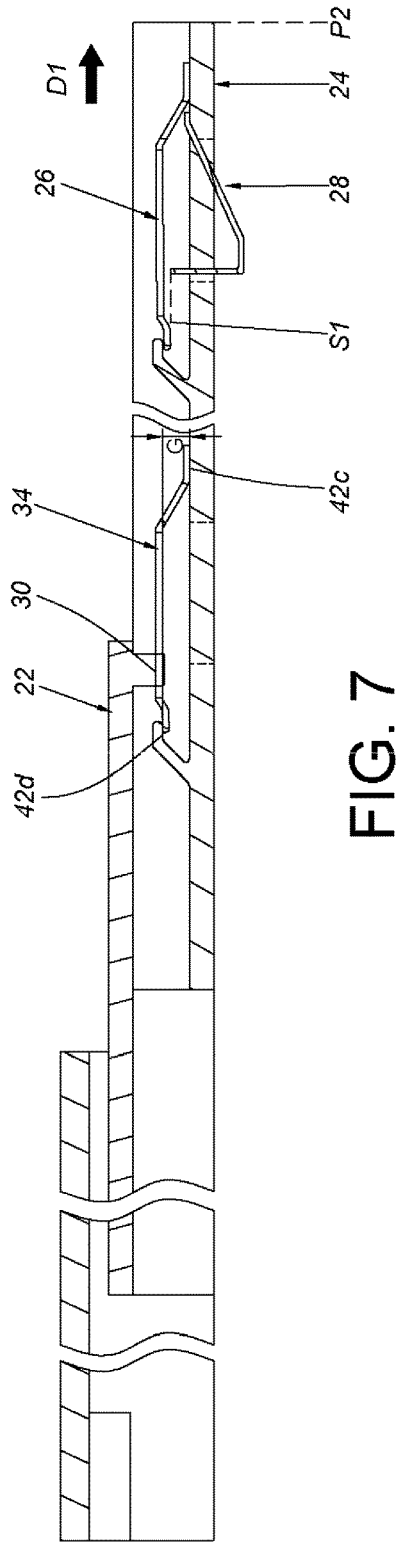

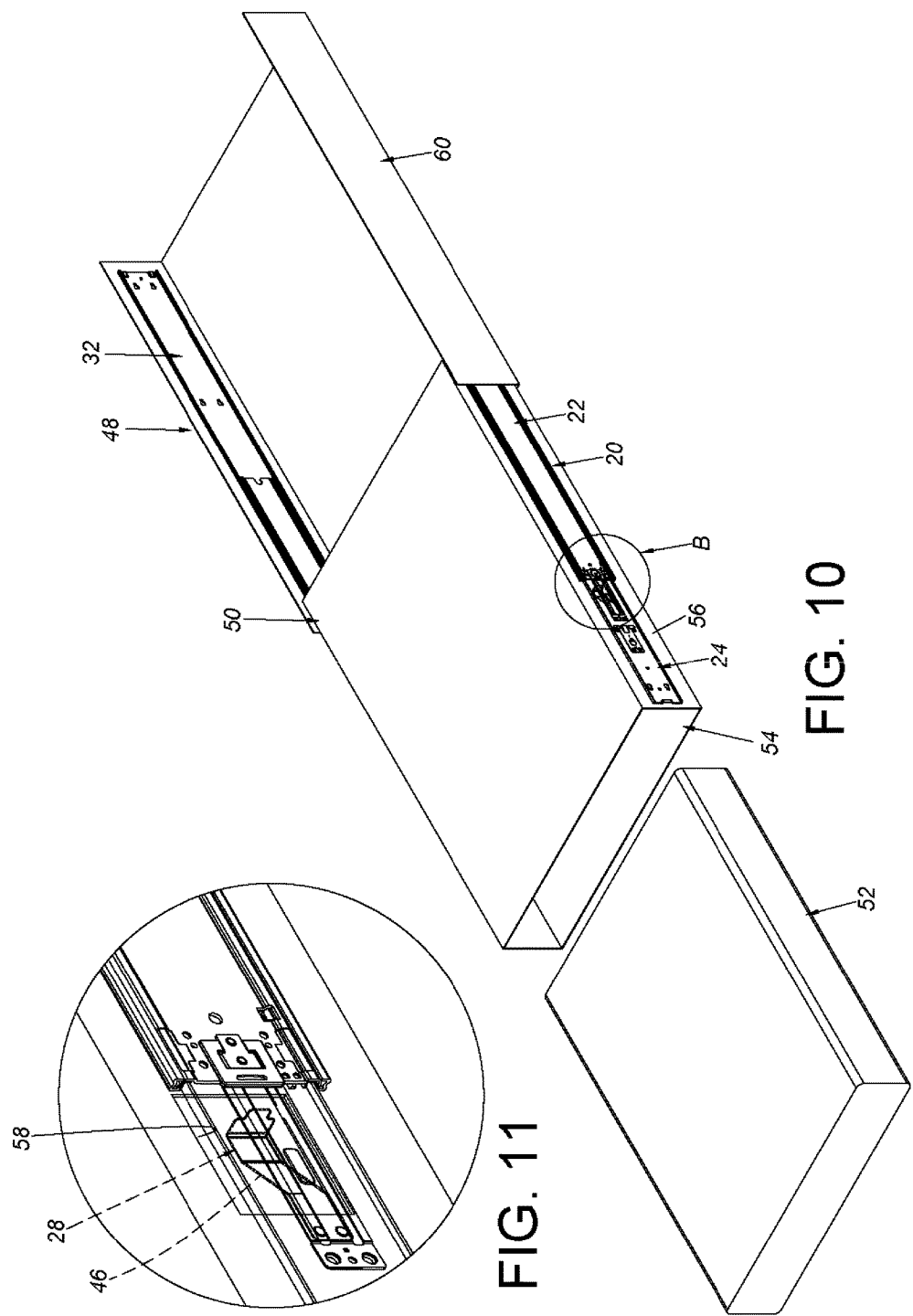

SLIDE RAIL ASSEMBLY

CROSS REFERENCE TO RELATED APPLICATIONS

This application is a divisional application of U.S. application Ser. No. 15/385,830, filed on Dec. 20, 2016. This application claims the benefit of U.S. application Ser. No. 15/385,830, which was filed on Dec. 20, 2016, and is incorporated herein by reference.

BACKGROUND OF THE INVENTION

1. Field of the Invention

The present invention relates to a slide rail assembly, and more particularly, to a slide rail assembly for a chassis system.

2. Description of the Prior Art

U.S. Pat. No. 6,685,033 B1 discloses a slide assembly for a chassis system. The slide assembly (405) carries a plurality of chassis comprising a device (505) and an air duct (520). When the slide assembly (405) is totally pulled out from a rack structure (615), as shown in FIG. 6, the slide assembly has to bear the weight of the device (505) and the air duct (520).

The above operation mode may not affect operation and maintenance for a lighter chassis system. However, when the slide assembly is totally pulled out to carry a plurality of heavier chassis, the slide assembly is at the risk of deformation, so as to cause safety issue during operation and maintenance.

SUMMARY OF THE INVENTION

The present invention provides a slide rail assembly for a chassis system, wherein the chassis system comprises a first chassis and a second chassis detachably mounted on the first chassis. The chassis system allows safer operation and maintenance through arrangement of the slide rail assembly.

According to an embodiment of the present invention, a slide rail assembly comprises a first rail comprising a blocking feature; a second rail movable relative to the first rail along a longitudinal direction; a first releasing member mounted on the second rail, wherein the first releasing member is configured to abut against the blocking feature when the first releasing member is located at a first position, and the first releasing member does not abut against the blocking feature when the first releasing member is located at a second position; and a limiting member arranged to be corresponding to the first releasing member, wherein the limiting member is configured to be in a free status or a limiting status; wherein when the limiting member is in the free status, the first releasing member is configured to be operatively moved from the first position to the second position; when the limiting member is in the limiting status, the first releasing member is not able to be operatively moved from the first position to the second position.

Preferably, when the second rail is moved relative to the first rail from a retracted position to a first extended position, the first releasing member abuts against the blocking feature of the first rail at the first position.

Preferably, the blocking feature is located adjacent to an end of the first rail.

Preferably, the first releasing member comprises a first end part, a second end part and an operating part connected between the first end part and the second end part, the operating part has a slot, the second rail comprises a first part and a second part, a step is formed between the first part and the second part, the first end part of the first releasing member is mounted to the first part of the second rail, the second end part of the first releasing member abuts against the second part of the second rail, the operating part of the first releasing member is configured to be operatively moved according to the step, in order to allow the first releasing member to be disengaged from the blocking feature of the first rail.

Preferably, a through hole is formed on the second and corresponding to the first releasing member, the limiting member is mounted on the second rail, the limiting member comprises an elastic part extended along a transverse direction, when a force is applied to the limiting member to drive the limiting member to abut against the first releasing member, the first releasing member is not able to be operatively moved from the first position to the second position.

Preferably, the slide rail assembly further comprises a second releasing member mounted on the second rail, when the second rail is moved relative to the first rail from the first extended position to a second extended position, the second releasing member is configured to abut against the blocking feature of the first rail.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is an exploded view of a slide rail assembly according to an embodiment of the present invention.

FIG. 2 is an enlarged view of an area A of FIG. 1.

FIG. 4 is a diagram showing the slide rail assembly at a retracted position according to an embodiment of the present invention.

FIG. 5 is a diagram showing the slide rail assembly at a first extended position according to an embodiment of the present invention.

FIG. 6 is a diagram showing an operation of applying a first force to a first releasing member of the slide rail assembly according to an embodiment of the present invention.

FIG. 7 is a diagram showing the slide rail assembly at a second extended position according to an embodiment of the present invention.

FIG. 10 is a diagram showing the slide rail assembly applied to a chassis system according to an embodiment of the present invention.

FIG. 11 is an enlarged view of an area B of FIG. 10.

DETAILED DESCRIPTION

Figure 3:
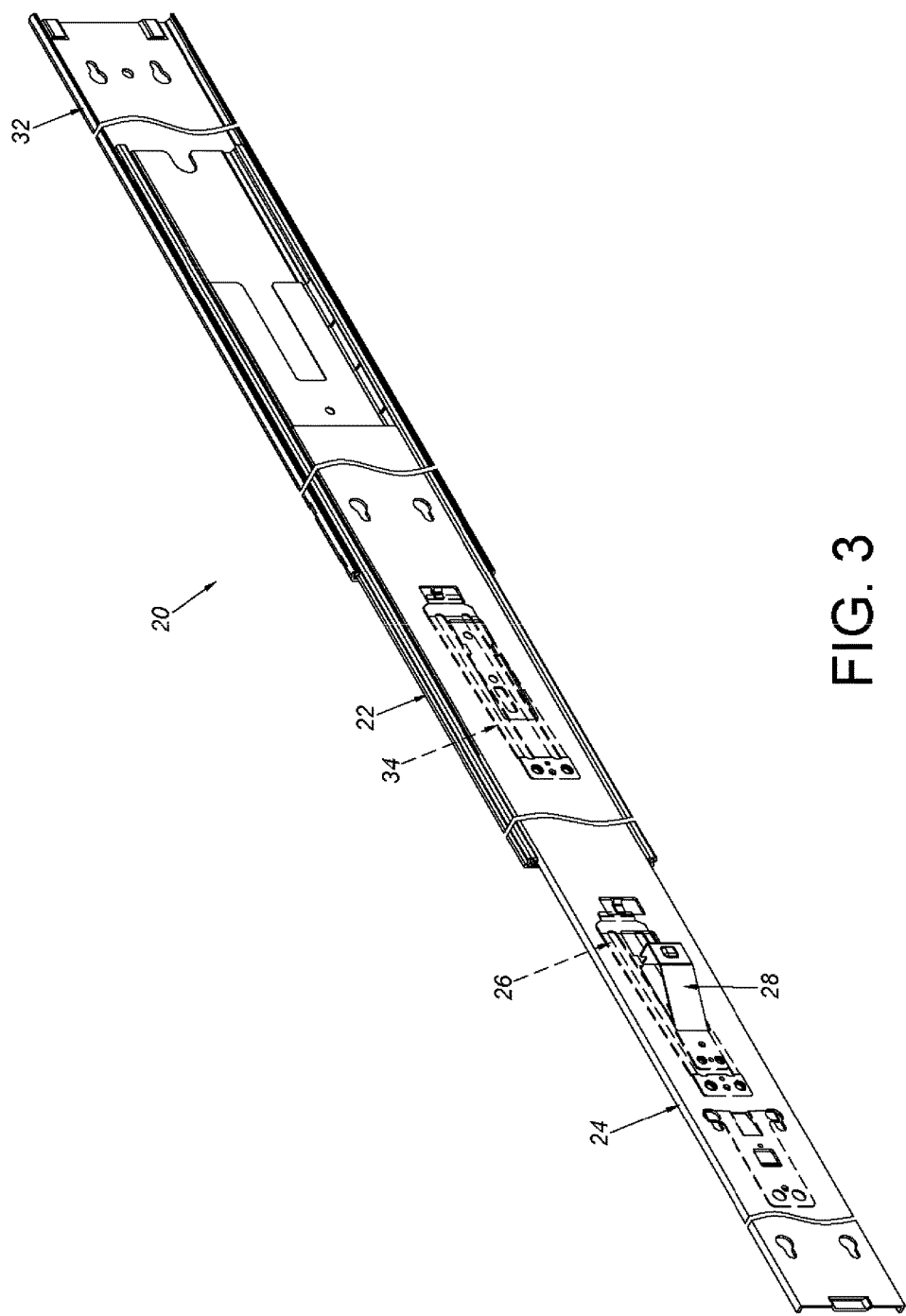
FIG. 3 is a diagram showing the slide rail assembly in an extended state according to an embodiment of the present invention.

FIG. 1 to FIG. 3 show a slide rail assembly 20 according to an embodiment of the present invention. The slide rail assembly 20 comprises a first rail 22, a second rail 24 movable relative to the first rail 22 along a longitudinal direction, a first releasing member 26 mounted on the second rail 24, and a limiting member 28 arranged to be corresponding to the first releasing member 26. Preferably, the first rail 22 comprises at least one blocking feature 30. In the present embodiment, the first rail 22 comprises two blocking features 30. The blocking feature 30 is located adjacent to an end of the first rail 22.

Preferably, the slide rail assembly 20 further comprises a fixed rail 32. The first rail 22 is movable relative to the fixed rail 32.

Preferably, the slide rail assembly 20 further comprises a second releasing member 34 mounted on the second rail 24.

Preferably, as shown in FIG. 1 and FIG. 4, the first releasing member 26 comprises a first end part 36a, a second end part 36b and an operating part 38 connected between the first end part 36a and the second end part 36b. The operating part 38 has at least one slot 40. In the present embodiment, the operating part 38 has two slots 40. The second rail 24 comprises a first part 42a and a second part 42b. A step G is formed between the first part 42a and the second part 42b. The first end part 36a of the first releasing member 26 is mounted to the first part 42a of the second rail 24. The second end part 36b of the first releasing member 26 abuts against the second part 42b of the second rail 24.

As shown in FIG. 4 and FIG. 5, when the second rail 24 is moved from a retracted position P0 to a first extended position P1 relative to the first rail 22 along a direction D1, the blocking feature 30 of the first rail 22 extends into the slot 40 of the operating part 38, such that the first releasing member 26 is able to abut against the blocking feature 30 of the first rail 22, in order to prevent the second rail 24 from moving further relative to the first rail 22 along the direction D1.

As shown in FIG. 6 and FIG. 7, the first releasing member 26 is operatively moved by a first force F1 from the first position L1 to the second position L2 according to the step G, such that the first releasing member 26 is disengaged from the blocking feature 30 of the first rail 22.

Preferably, the second releasing member 34 of the slide rail assembly 20 is mounted between a third part 42c and a fourth part 42d of the second rail 24. Wherein, a step G is also formed between the third part 42c and the fourth part 42d. When the second rail 24 is moved relative to the first rail 22 from the first extended position P1 to a second extended position P2, the second releasing member 34 is configured to abut against the blocking feature 30 of the first rail 22.

Figure 8:
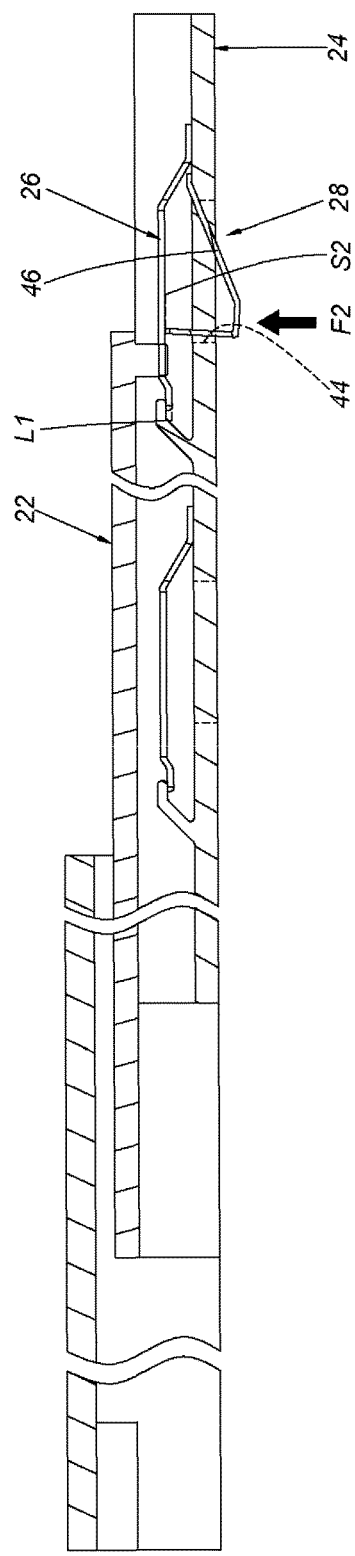
FIG. 8 is a diagram showing the limiting member driven by a second force when the slide rail assembly is located at the first extended position according to an embodiment of the present invention.
Figure 9:
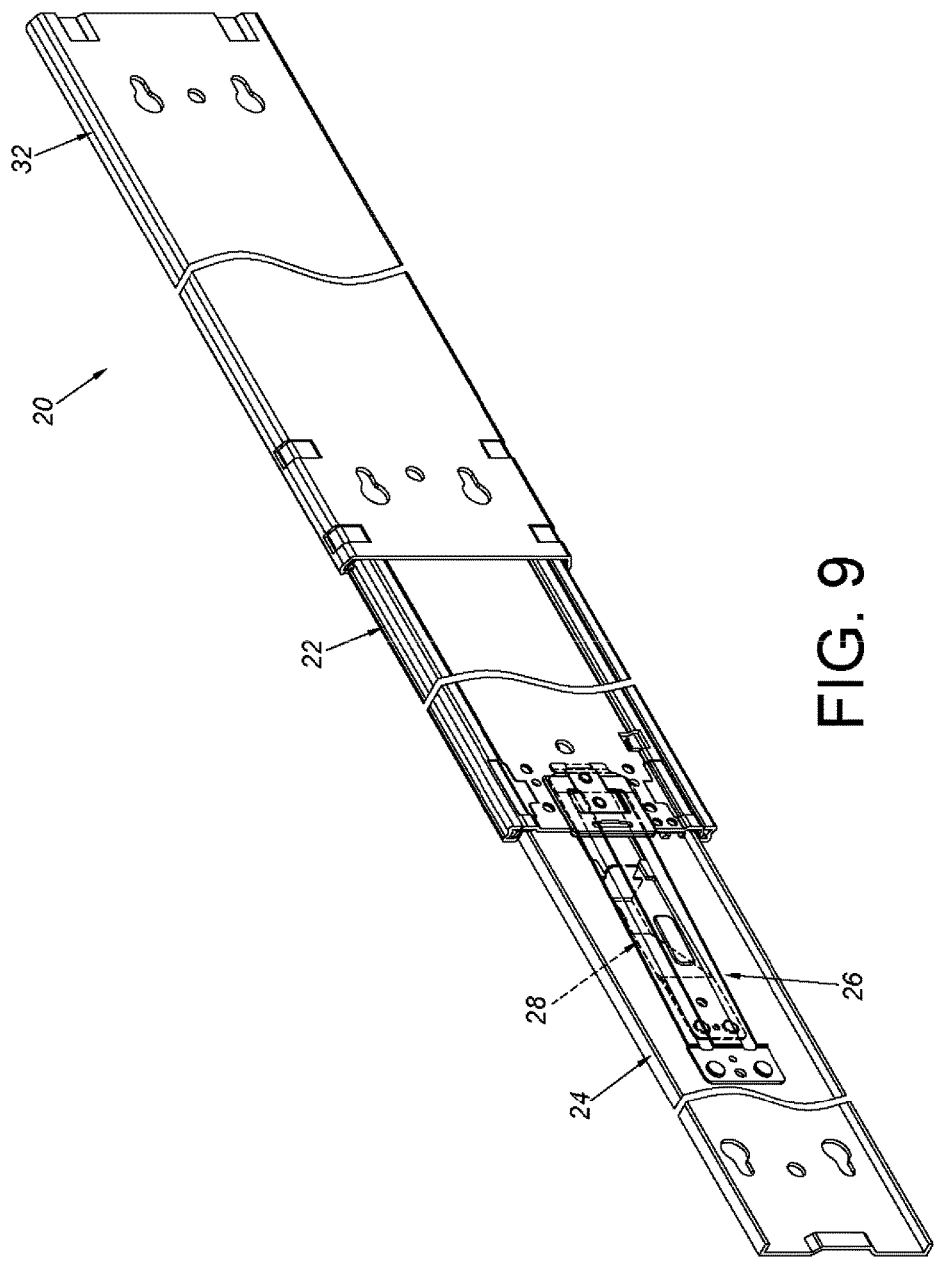
FIG. 9 is s a diagram showing the slide rail assembly in the extended state in another angle according to an embodiment of the present invention.

Preferably, as shown in FIG. 8 and FIG. 9, a through hole 44 is formed on the second rail 24 corresponding to the first releasing member 26. The limiting member 28 is arranged on the second rail 24. The limiting member 28 comprises an elastic part 46 extended along a transverse direction. When a second force F2 is applied to the limiting member 28 to drive the limiting member 28 to abut against the first releasing member 26, the first releasing member 26 is not able to be operatively moved from the first position L1 to the second position L2.

According to the above illustration, the limiting member 28 is configured to be in a free status S1 (as shown in FIG. 4 and FIG. 5) or a limiting status S2 (as shown in FIG. 8); wherein, when the limiting member 28 is in the free status S1, the first releasing member 26 is configured to be operatively moved from the first position L1 to the second position L2 (as shown in FIG. 6); when the limiting member 28 is in the limiting status S2, the first releasing member 26 is not able to be operatively moved from the first position L1 to the second position L2.

Figure 12:
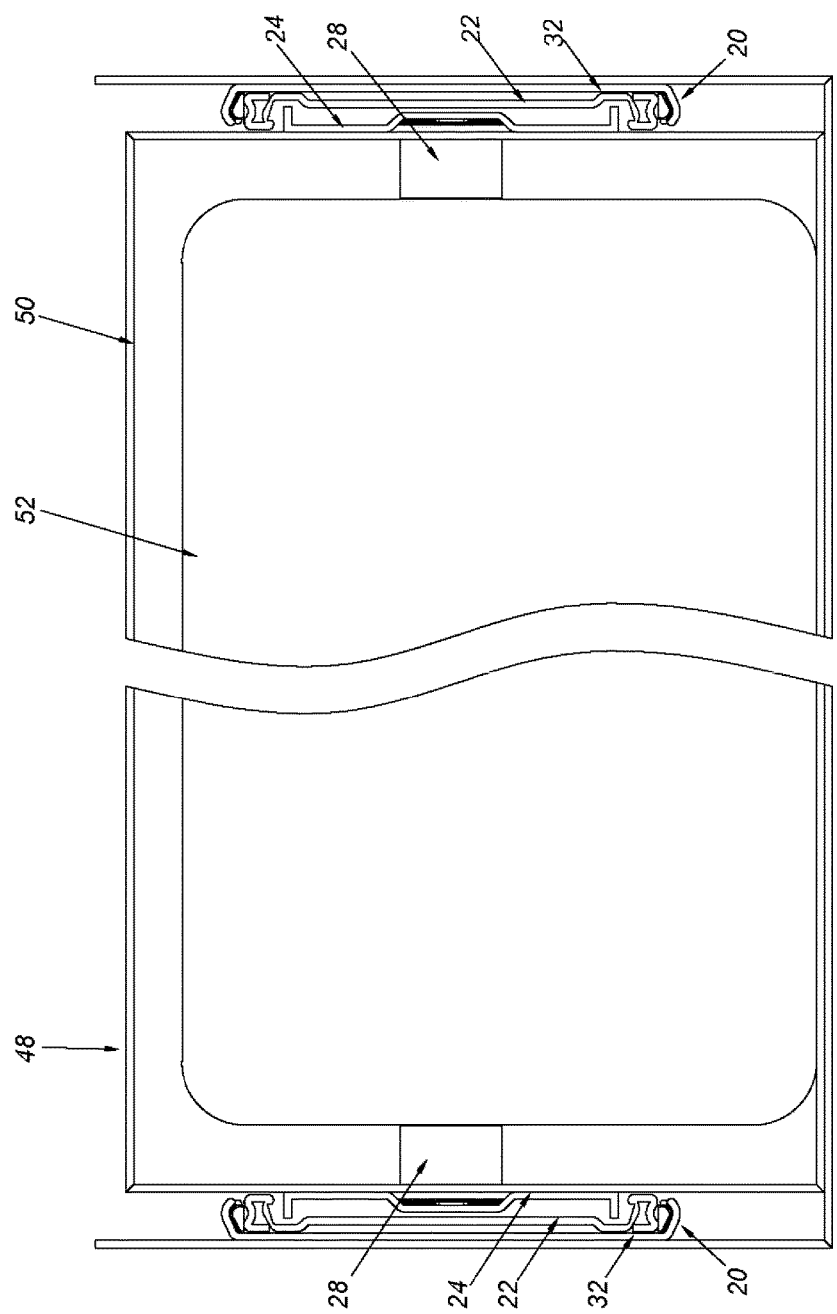
FIG. 12 is a diagram showing arrangement between the chassis system and the slide rail assembly in a retracted state according to an embodiment of the present invention.

FIG. 10 to FIG. 12 show the slide rail assembly 20 applied to a chassis system 48 according to an embodiment of the present invention. The chassis system 48 comprises a first chassis 50 and a second chassis 52 detachably mounted on the first chassis 50. The second rail 24 of the slide rail assembly 20 is mounted on the first chassis 50. Wherein, the limiting member 28 is driven by the second chassis 52 to limit the first releasing member 26, such that the first releasing member 26 is not able to be pressed to move, so as to be in the status shown in FIG. 8. Wherein, when the second chassis 52 is detached from the first chassis 50, the first releasing member 26 is able to be operatively pressed to move, so as to be in the status shown in FIG. 6.

Specifically, the first chassis 50 of the chassis system 48 has an inner space 54, the first chassis 50 comprises a wall 56, and the wall 56 has an opening 58 communicated with the inner space 54. The elastic part 46 of the limiting member 28 passes through the opening 58 of the first chassis 50 to be located in the inner space 54 of the first chassis 50. Wherein, when the second chassis 52 is arranged in the inner space 54 of the first chassis 50, the limiting member 28 is moved toward to the first releasing member 26 by the second chassis 52 (such as the status shown in FIG. 8); when the second chassis 52 is detached from the first chassis 50, the first releasing member 26 is able to be operatively moved from the first position L1 to the second position L2 (such as the status shown in FIG. 6), in order to allow the first releasing member 26 to be disengaged from the blocking feature 30 of the first rail 22 at the second position L2.

Preferably, the chassis system 48 further comprises a housing 60 configured to accommodate the first chassis 50. The fixed rail 32 of the slide rail assembly 20 is configured to mount on the housing 60. The first rail 22 of the slide rail assembly 20 is movable relative to the fixed rail 32.

According to the above arrangement, the slide rail assembly 20 of the present invention is capable of allowing the first chassis 50 and the second chassis 52 to move relative to the housing 60 from the retracted position P0 (as shown in FIG. 4) to the first extended position P1 (as shown in FIG. 5). When the first chassis 50 and the second chassis 52 are at the first extended position P1, since the second chassis 52 is located in the first chassis 50, the first chassis 50 and the second chassis 52 cannot be further pulled out relative to the housing 60. In other words, when the second chassis 52 is located in the first chassis 50, the limiting member 28 is moved toward the first rail 22, so as to limit the first releasing member 26, such that the first releasing member 26 is not able to be pressed to move until the second chassis 52 is detached from the first chassis 50 (as shown in FIG. 6). Therefore, the first chassis 50 can be further moved to the second extended position P2 (as shown in FIG. 7). Thereby, the present invention allows more convenient and safer maintenance and replacement for the chassis.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A slide rail assembly, comprising:
a first rail comprising a blocking feature;
a second rail movable relative to the first rail along a longitudinal direction;
a first releasing member mounted on the second rail, wherein the first releasing member is configured to abut against the blocking feature when the first releasing member is located at a first position, and the first releasing member does not abut against the blocking feature when the first releasing member is located at a second position; and
a limiting member arranged to be corresponding to the first releasing member, wherein the limiting member is configured to be in a free status or a limiting status;
wherein when the limiting member is in the free status, the first releasing member is configured to be operatively moved from the first position to the second position, such that the limiting member in the free status allows the first releasing member to be disengaged from the blocking feature of the first rail; when the limiting member is in the limiting status, the first releasing member is abutted by the limiting member and not able to be operatively moved from the first position to the second position, such that the limiting member in the limiting status prevents the first releasing member from being disengaged from the blocking feature of the first rail.

2. The slide rail assembly of claim 1, wherein when the second rail is moved relative to the first rail from a retracted position to a first extended position, the first releasing member abuts against the blocking feature of the first rail at the first position.

3. The slide rail assembly of claim 2, wherein the blocking feature is located adjacent to an end of the first rail.

4. The slide rail assembly of claim 2, wherein the first releasing member comprises a first end part, a second end part and an operating part connected between the first end part and the second end part, the operating part has a slot, the second rail comprises a first part and a second part, a step is formed between the first part and the second part, the first end part of the first releasing member is mounted to the first part of the second rail, the second end part of the first releasing member abuts against the second part of the second rail, the operating part of the first releasing member is configured to be operatively moved according to the step, in order to allow the releasing member to be disengaged from the blocking feature of the first rail.

5. The slide rail assembly of claim 1, wherein a through hole is formed on the second rail and corresponding to the first releasing member, the limiting member is mounted on the second rail, the limiting member comprises an elastic part extended along a transverse direction, when a force is applied to the limiting member to drive the limiting member to abut against the first releasing member, the first releasing member is not able to be operatively moved from the first position to the second position.

6. The slide rail assembly of claim 2, further comprising a second releasing member mounted on the second rail, when the second rail is moved relative to the first rail from the first extended position to a second extended position, the second releasing member is configured to abut against the blocking feature of the first rail.

* * * * *